United States Patent
Simons et al.

(10) Patent No.: US 10,962,890 B2
(45) Date of Patent: Mar. 30, 2021

(54) POSITIONING DEVICE, LITHOGRAPHIC APPARATUS, METHOD FOR COMPENSATING A BALANCE MASS TORQUE AND DEVICE MANUFACTURING METHOD

(71) Applicant: ASML Netherlands B.V., Veldhoven (NL)

(72) Inventors: Wilhelmus Franciscus Johannes Simons, Beesel (NL); Dave Braaksma, Veldhoven (NL); Hans Butler, Best (NL); Hendrikus Herman Marie Cox, Eindhoven (NL); René Wilhelmus Antonius Hubertus Leenaars, Eindhoven (NL); Stephan Christiaan Quintus Libourel, Veldhoven (NL); Martinus Van Duijnhoven, Deurne (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/959,738

(22) PCT Filed: Nov. 29, 2018

(86) PCT No.: PCT/EP2018/082983
§ 371 (c)(1),
(2) Date: Jul. 2, 2020

(87) PCT Pub. No.: WO2019/134776
PCT Pub. Date: Jul. 11, 2019

(65) Prior Publication Data
US 2020/0363732 A1    Nov. 19, 2020

(30) Foreign Application Priority Data

Jan. 4, 2018 (EP) .................................. 18150247

(51) Int. Cl.
*G03F 7/20* (2006.01)

(52) U.S. Cl.
CPC .......... *G03F 7/70758* (2013.01); *G03F 7/709* (2013.01); *G03F 7/70716* (2013.01); *G03F 7/70766* (2013.01)

(58) Field of Classification Search
CPC ............. G03F 7/70766; G03F 7/70758; G03F 7/70716; G03F 7/709
(Continued)

(56) References Cited

U.S. PATENT DOCUMENTS

| 9,122,173 B2 * | 9/2015 | Butler ................ G03F 7/70766 |
| 2001/0006762 A1 | 7/2001 | Kwan et al. |

(Continued)

FOREIGN PATENT DOCUMENTS

WO    WO 2017/108284 A1    6/2017

OTHER PUBLICATIONS

International Search Report and Written Opinion of the International Search Authority directed to related International Patent Application No. PCT/EP2018/082983, dated Apr. 5, 2019; 9 pages.

(Continued)

*Primary Examiner* — Hung Nguyen
(74) *Attorney, Agent, or Firm* — Sterne, Kessler, Goldstein & Fox P.L.L.C.

(57) ABSTRACT

The present invention relates to a positioning system, including: a first actuator to exert an actuation force on a moveable body, the first actuator being coupled to a balance mass configured to absorb a reaction force resulting from the actuation force, the actuation force providing an acceleration of the moveable body and the reaction force providing an acceleration of the balance mass, wherein a force resulting from the acceleration of the moveable body together with a force resulting from the acceleration of the balance mass (Continued)

result in a balance mass torque; a balance mass support to support the balance mass onto a frame, which balance mass support engages the frame at a support position; and a torque compensator; wherein the torque compensator exerts a compensation force to compensate the balance mass torque, and wherein the torque compensator exerts the compensation force on the frame at the support position.

15 Claims, 9 Drawing Sheets

(58) Field of Classification Search
USPC .................................................. 355/72–76
See application file for complete search history.

(56) References Cited

U.S. PATENT DOCUMENTS

2009/0262325 A1    10/2009  Butler et al.
2013/0088703 A1    4/2013   Watson

OTHER PUBLICATIONS

International Preliminary Report on Patentability directed to related International Patent Application No. PCT/EP2018/082983, dated Jul. 7, 2020; 7 pages.

* cited by examiner

POSITIONING DEVICE, LITHOGRAPHIC APPARATUS, METHOD FOR COMPENSATING A BALANCE MASS TORQUE AND DEVICE MANUFACTURING METHOD

CROSS-REFERENCE TO RELATED APPLICATIONS

This application claims priority of EP application 18150247.7 which was filed on 4 Jan. 2018 and which is incorporated herein in its entirety by reference.

BACKGROUND

Field of the Invention

The present invention relates to a positioning device, a lithographic apparatus, a method for compensating a balance mass torque and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In a lithographic apparatus, some parts have to be positioned very accurately in order to obtain the desired quality of the pattern on the substrate, e.g. in terms of focus and position. Most of these parts are connected either directly or indirectly to the base frame of the lithographic apparatus. In order to achieve the desired quality of the pattern on the substrate, it is desirable that the base frame is very stable and that the deformation of the base frame is kept as small as possible.

One example of an elements of the lithographic apparatus which exerts mechanical forces onto the base frame is the balance mass of the wafer stage. In a commonly used design, the wafer stage is actuated by a planar motor, providing an acceleration of the wafer stage. The reaction forces that result from this actuation are absorbed by a balance mass, which due to the reaction force is accelerated in the opposite direction. The balance mass is connected to the base frame by a balance mass support.

Due to the distance between the centre of gravity of the wafer stage and the centre of gravity of the balance mass, the acceleration force of the wafer stage and the acceleration force of the balance mass together result in a torque which is transmitted to the base frame by the balance mass support.

Similar situations occur at different parts of the lithographic apparatus as well, e.g. at the reticle stage or at the reticle mask unit.

SUMMARY

It is desirable to provide a positioning device which reduces the impact of a torque caused by the combination of acceleration forces of a moveable body and acceleration forces of a balance mass related to said movable body on the frame of said lithographic apparatus.

According to an embodiment of the invention, there is provided a positioning device, which positioning device comprises:
a first actuator configured to exert an actuation force on a moveable body, the first actuator being coupled to a balance mass configured to absorb a reaction force resulting from the actuation force generated by the first actuator, the actuation force providing an acceleration of the moveable body and the reaction force providing an acceleration of the balance mass in the opposite direction, wherein a force resulting from the acceleration of the moveable body together with a force resulting from the acceleration of the balance mass together result in a balance mass torque;
a balance mass support, which is configured to support the balance mass onto a frame, which balance mass support engages the frame at a support position; and
a torque compensator;
wherein the torque compensator is configured to exert a compensation force to compensate the balance mass torque, and
wherein the torque compensator is configured to exert the compensation force on the frame at the support position.

According to another embodiment of the invention, there is provided a positioning device, which positioning device comprises:
a first actuator configured to exert an actuation force on a moveable body, the first actuator being coupled to a balance mass configured to absorb a reaction force resulting from the actuation force generated by the first actuator, the actuation force providing an acceleration of the moveable body and the reaction force providing an acceleration of the balance mass in the opposite direction, wherein a force resulting from the acceleration of the moveable body together with a force resulting from the acceleration of the balance mass together result in a balance mass torque;
a balance mass support, which is configured to support the balance mass onto a frame, which balance mass support engages the frame at a support position; and
a torque compensator;
wherein the torque compensator is configured to exert a compensation force to compensate the balance mass torque, and
wherein the torque compensator is configured to exert the compensation force on the frame at a compensator position, which compensator position is spaced apart from the support position, and
wherein the compensator position is connected to the support position via a portion of the frame, which portion of the frame is more rigid than the balance mass support.

In another embodiment of the invention, there is provided a lithographic apparatus comprising a positioning device according to the invention.

In another embodiment of the invention, there is provided a method for compensating a balance mass torque in a positioner system, which method comprises the following steps:

generating a balance mass torque by exerting an actuation force on a moveable body and absorbing a reaction force resulting from the actuation force by a balance mass, thereby causing an acceleration of the moveable body and an acceleration of the balance mass in an opposite direction, wherein a force resulting from the acceleration of the moveable body together with a force resulting from the acceleration of the balance mass together result in a balance mass torque, which balance mass torque is exerted via a balance mass support onto a frame at a support position, compensating the balance mass torque exerted on the frame by a torque compensator which exerts a compensation force on the frame at the support position.

In another embodiment of the invention, there is provided a method for compensating a balance mass torque in a positioner system, generating a balance mass torque by exerting an actuation force on a moveable body and absorbing a reaction force resulting from the actuation force by a balance mass, thereby causing an acceleration of the moveable body and an acceleration of the balance mass in an opposite direction, wherein a force resulting from the acceleration of the moveable body together with a force resulting from the acceleration of the balance mass together result in a balance mass torque, which balance mass torque is exerted via a balance mass support onto a frame at a support position, compensating the balance mass torque exerted on the frame by a torque compensator which exerts a compensation force at a compensator position, which compensator position is spaced apart from the support position, and wherein the compensator position is connected to the support position via a portion of the frame, which portion of the frame is more rigid than the balance mass support.

In another embodiment of the invention, there is provided a device manufacturing method comprising transferring a pattern from a patterning device onto a substrate, comprising the step of using a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
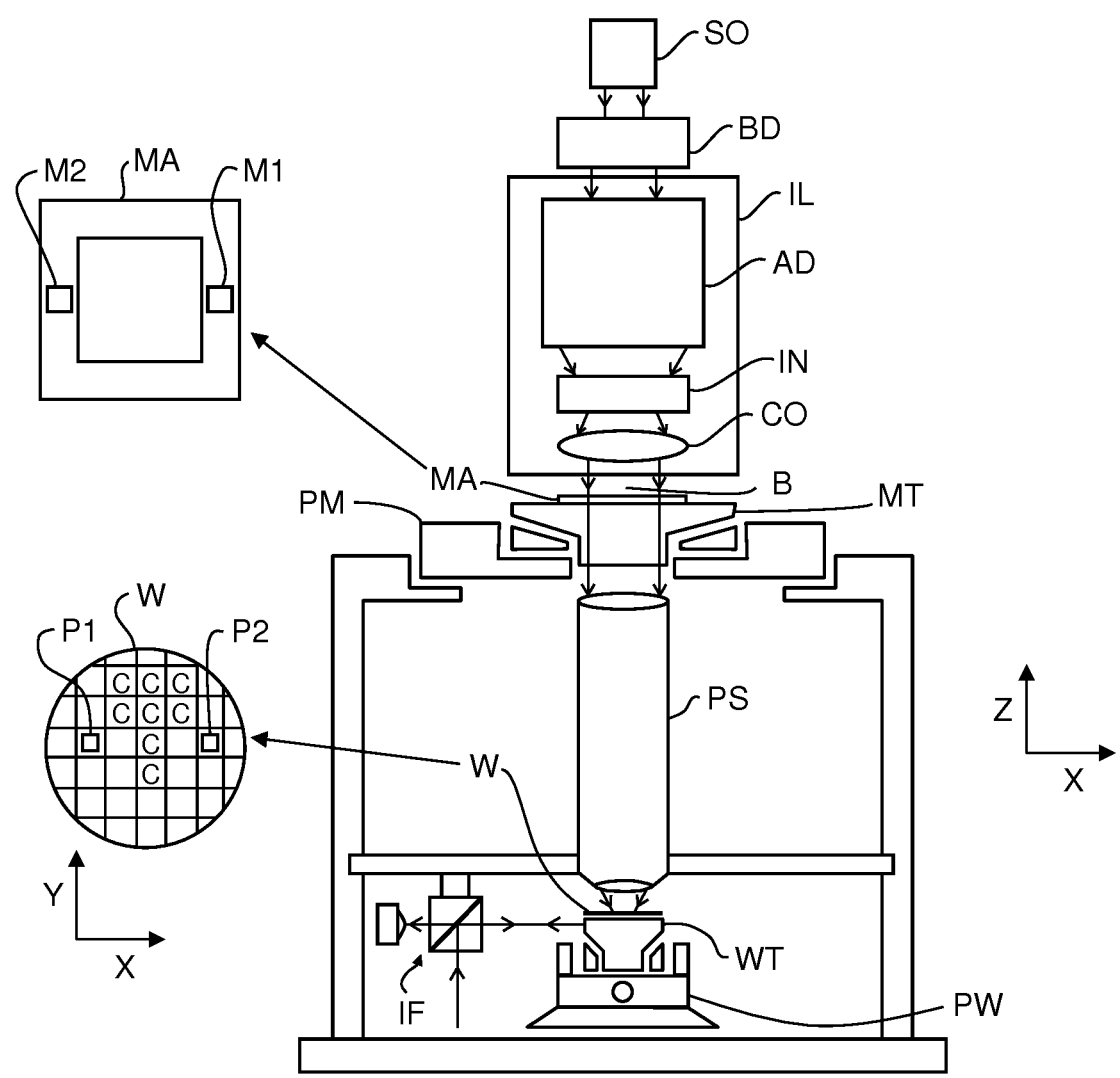
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure MT may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to the at least one substrate table WT, the lithographic apparatus may comprise a measurement table, which is arranged to perform measurements but is not arranged to hold a substrate W. The measurement table may be arranged to hold sensor to measure a property of the projection system PS, such as an intensity of the radiation beam B, an aberration of the projection system PS or a uniformity of the radiation beam B. The measurement table may be arranged to hold a cleaning device to clean at least a part of the lithographic apparatus, for example a part near a last lens element of the projection system PS.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may include various other components, such as an integrator IN and a condenser CO. The illuminator IL may be used to condition the radiation beam, to have a desired uniformity and intensity distribution in its cross section.

The radiation beam B is incident on the patterning device MA, which is held on the mask support structure MT, and is patterned by the patterning device. Having traversed the patterning device MA, the radiation beam B passes through the projection system PS, which focuses the radiation beam B onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Such dedicated target portions are known as scribe-lane alignment marks). Similarly, in situations in which more than one die is provided on the patterning device MA, the mask alignment marks M1,M2 may be located between the dies.

The depicted apparatus could be used in at least one of the following modes:

1. In step mode, the mask support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask support structure MT and the substrate table WT or "substrate support" are scanned synchronously while a pattern imparted to the radiation beam is projected onto a target portion C (i.e. a single dynamic exposure). The velocity and direction of the substrate table WT relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion C.

3. In another mode, the mask support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
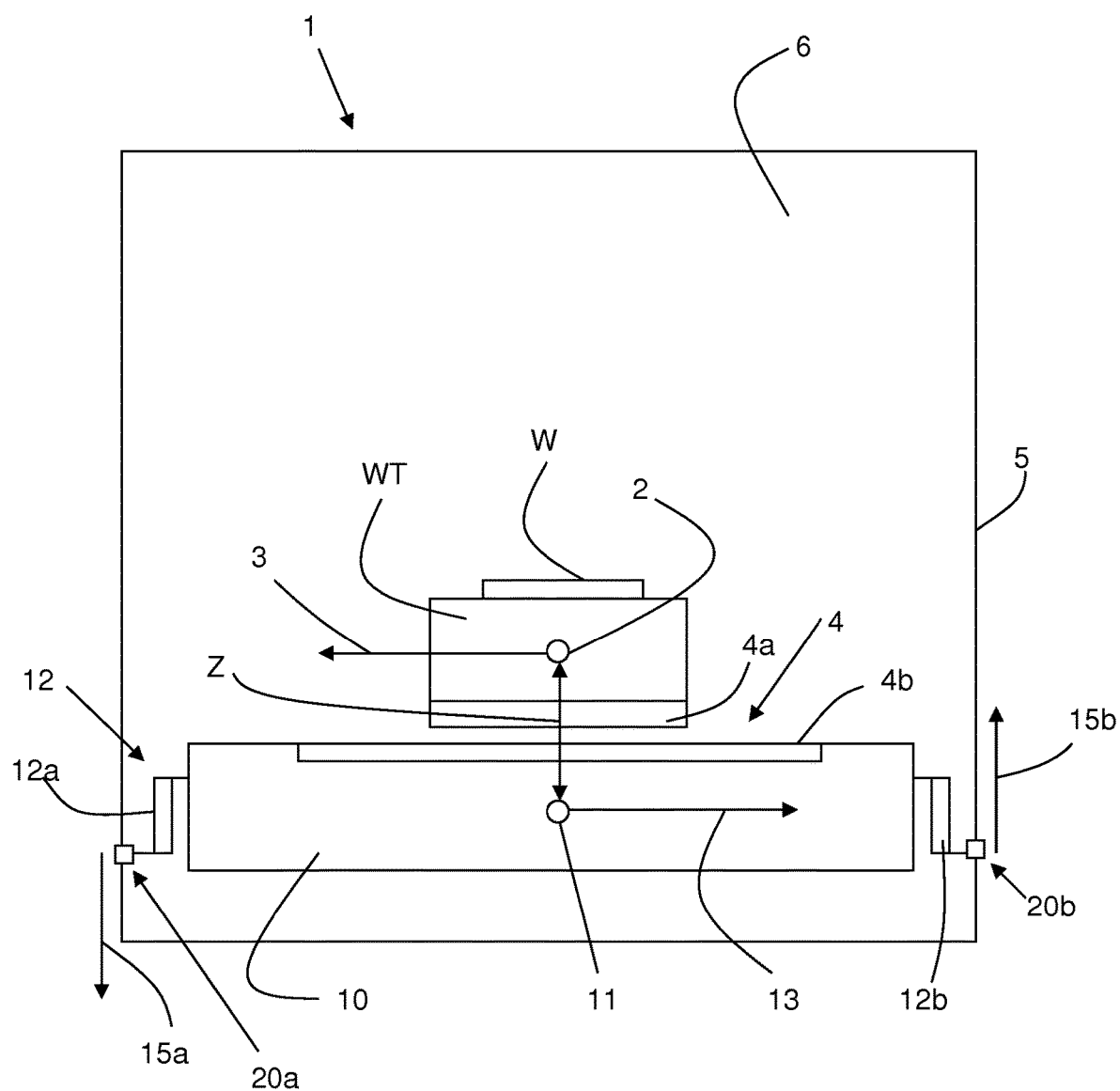
FIG. 2 schematically shows a possible embodiment of a positioning device as is used in a lithographic apparatus, FIG. 3 schematically shows a possible embodiment of a positioning system 1 in accordance with the invention, FIG. 4 schematically shows a detail of FIG. 3, FIG. 5 schematically shows the embodiment of FIG. 3 in top view, FIG. 6 schematically shows a variant of the embodiment of FIG. 3 in top view, FIG. 7 schematically shows a further variant of the embodiment of FIG. 3 in top view, FIG. 8 schematically shows the further embodiment a positioning system according to the invention, in top view, FIG. 9 schematically shows a further embodiment of a positioner system according to the invention.

FIG. 2 schematically shows a possible embodiment of a positioning system 1 as is used in a lithographic apparatus. The positioning system 1 shown in FIG. 2 is an example of a second positioning device PW.

The positioning system 1 of FIG. 2 comprises a substrate support WT, onto which a substrate W, e.g. a wafer, can be arranged. The substrate support WT is arranged in a vacuum chamber 6, which in this example is enclosed by frame 5.

The positioning system 1 further comprises a first actuator 4. In this example, the first actuator is a planar motor, which includes a translator 4a and a stator 4b. The translator 4a is mounted to the substrate support WT.

The positioning system 1 further comprises a balance mass 10. The stator 4b of the first actuator 4 is mounted to the balance mass 10. The balance mass 10 is supported onto the frame 5 by balance mass support 12. In the embodiment of FIG. 2, the balance mass support 12 comprises a first balance mass support device 12a and a second balance mass support device 12b. The first and/or second balance mass support device 12a, 12b for example is or comprises a leaf spring.

The balance mass support 12 engages the frame 5 at a support position. Depending on the design of the balance mass support 12 and the frame 5, there may be a single support position or multiple support positions. In the example of FIG. 2, there are two support positions 20a, 20b.

The substrate table WT is a moveable body. The first actuator 4 can move the substrate support WT and the balance mass 10 relative to each other, and relative to the frame 5. The first actuator 4 is configured to exert and actuation force on the substrate support WT, which results in an acceleration of the substrate support WT. This actuation force provides an acceleration of the substrate support WT. From this acceleration of the substrate support WT, a force 3 results with the magnitude of $F_{wt}=m_{wt} \times a_{wt}$, in which $F_{wt}$ is the resulting force 3, $m_{wt}$ is the mass of the substrate support and $a_{wt}$ the acceleration of the substrate support WT.

The first actuator 4 is coupled to the balance mass 10. In the example of FIG. 2, this coupling is achieved by mounting the stator 4b of the first actuator 4 onto the balance mass 10. The balance mass 10 is configured to absorb the reaction force that results from the actuation force that is exerted on the substrate support WT. This results in an acceleration of the balance mass 10, in a direction opposite to the direction of the acceleration of the substrate support WT. From this acceleration of the balance mass 10, a force 13 results with the magnitude of $F_{bm}=m_{bm} \times a_{bm}$, in which $F_{bm}$ is the resulting force 13, $m_{bm}$ is the mass of the balance mass 10 and $a_{bm}$ the acceleration of the balance mass 10. The magnitude of the force 13 equals the magnitude of the force 3, but is directed in the opposite direction.

The substrate support WT has a centre of gravity 2, and the balance mass has a centre of gravity 11. As is clear from FIG. 2, there is a distance Z between the centre of gravity 2 of the substrate support WT and the centre of gravity 11 of the balance mass 10. This makes that a balance mass torque results from the combination of the force 3 and the force 13. This balance mass torque has a magnitude which equals $F_{wt} \times Z$, in which $F_{wt}$ is the magnitude of force 3, and Z is the distance between the centre of gravity 2 of the substrate support WT and the centre of gravity 11 of the balance mass 10.

The balance mass torque is transmitted to the frame 5 by the balance mass support 12. In the embodiment of FIG. 2, the balance mass torque is exerted onto the frame in the form of a force 15a which is exerted on the frame at the first support position 20a, and a force 15b which is exerted on the frame at the second support position 20b.

In FIG. 2, the positioning system 1 shown is an example of a second positioning device PW. However, it is also possible that for example a first positioning device PM is configured in accordance with FIG. 2. In that case, it is not the substrate support WT that is actuated by the first actuator, but a patterning device MA.

Figure 3:
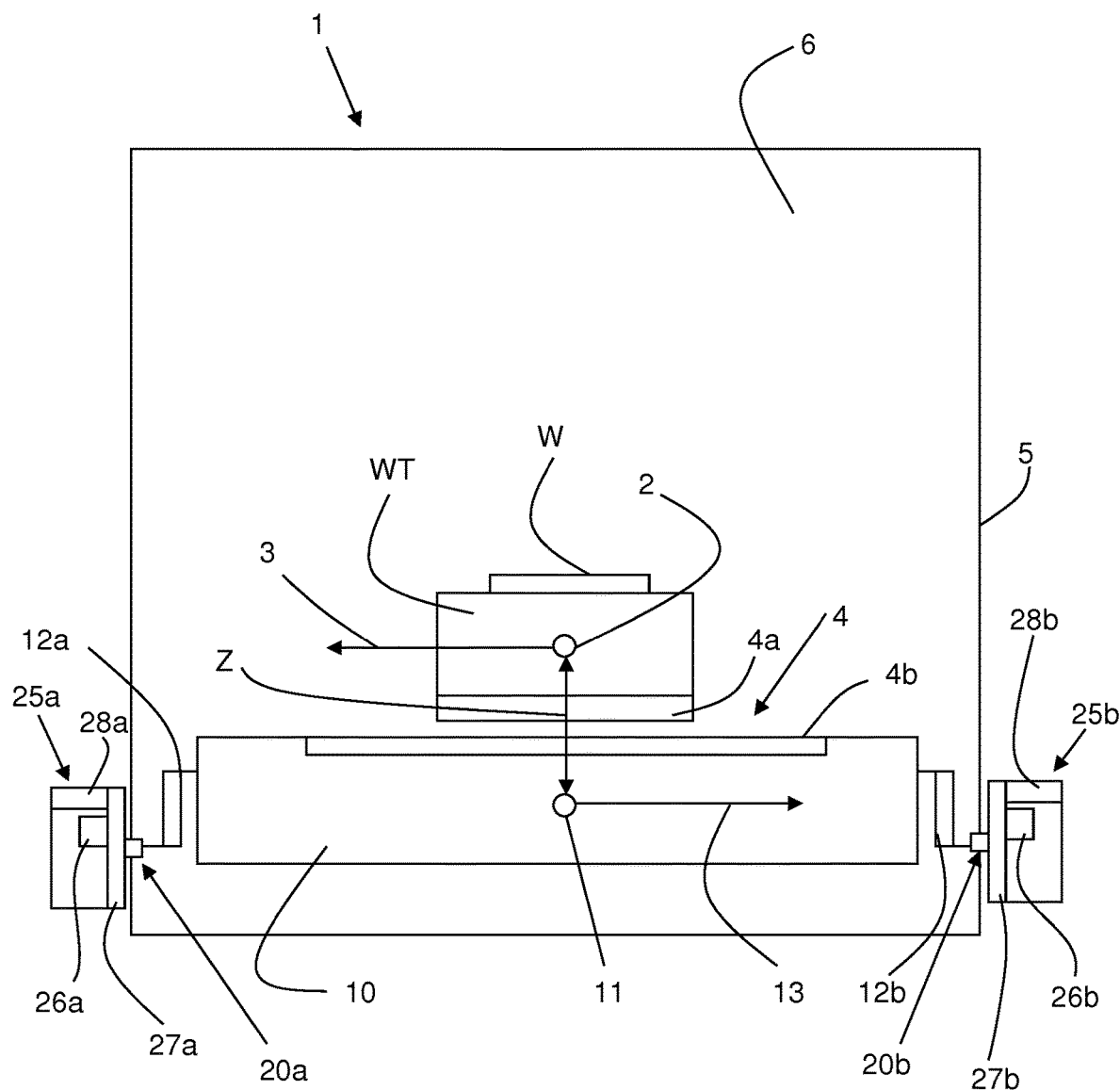

FIG. 3 schematically shows a possible embodiment of a positioning system 1 in accordance with the invention. This embodiment contains all elements of the positioning system 1 as shown in FIG. 2 and functions in the same way.

Figure 4:
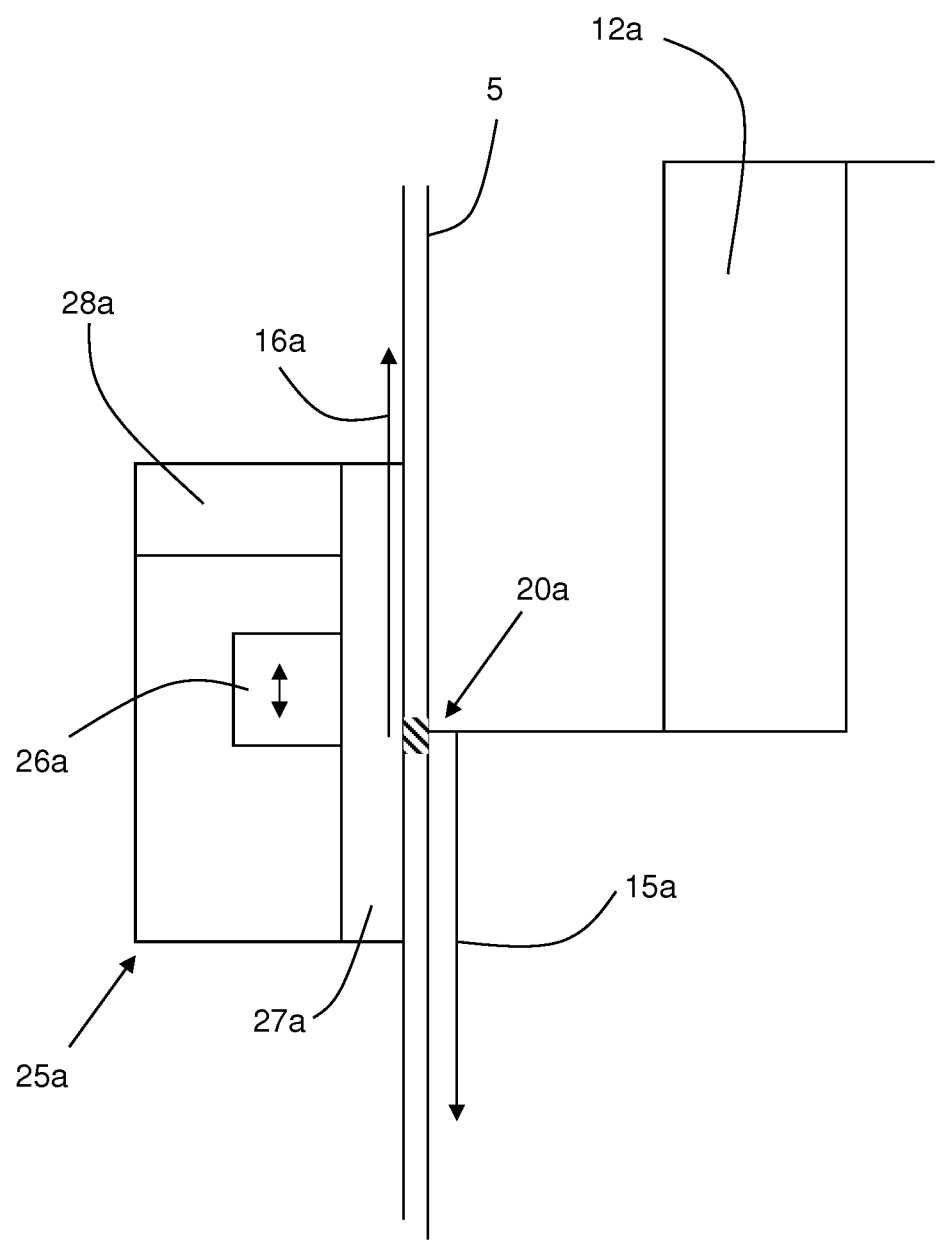

FIG. 4 shows the situation in the positioning system 1 of FIG. 3 in the vicinity of the first support position in more detail.

The main difference of the positioning system 1 of FIG. 3 with the positioning system 1 according to FIG. 2 is that the positioning system 1 of FIG. 3 comprises a torque compensator. The torque compensator is configured to exert a compensation force onto the frame to compensate the balance mass torque. The compensation force is exerted on the frame at the support position. This allows for an effective compensation of the balance mass torque, and for an advantageous dynamic behaviour for the frame 5.

In the embodiment of FIG. 3, the torque compensator comprises a first compensator actuator 25a and a second compensator actuator 25b. The first compensator actuator 25a exerts a first compensation force 16a (see FIG. 4) at the first support position 20a. The first compensation force 16a has the same magnitude as force 15a. The first compensation force 16a is directed in the opposite direction to force 15a. Therewith, the first compensation force 16a counteracts the force 15a. The second compensator actuator 25b exerts a second compensation force at the second support position 20b. The second compensation force has the same magnitude as force 15b. The second compensation force is directed in the opposite direction to force 15b. Therewith, the second compensation force counteracts the force 15b.

In the embodiment of FIG. 3 and FIG. 4, the first compensator actuator 25a comprises a moveable mass 26a and a linear motor 27a. The linear motor 27a is configured to move the movable mass 26a in order to generate compensation force 16a to counteract force 15a. The first compensator actuator 25a is arranged such that the first compensation force 16a is exerted on the frame 5 at the first support position 20a (indicated by the cross hatched area in FIG. 4). Optionally, the first balance mass support device 12a engages the frame at the first support position 20a on a surface of the frame 5 on the inside of the vacuum chamber 6 and the first compensator actuator 25a engages the frame 5 at the first support position 20a on a surface of the frame 5 outside the vacuum chamber 6.

In the embodiment of FIG. 3 and FIG. 4, the second compensator actuator 25b comprises a moveable mass 26b and a linear motor 27b. The linear motor 27b is configured to move the movable mass 26b in order to generate compensation force to counteract force 15b. The second compensator actuator 25b is arranged such that the second compensation force is exerted on the frame 5 at the second support position 20b. Optionally, the second balance mass support 12b engages the frame at the second support position 20b on a surface of the frame 5 on the inside of the vacuum chamber 6 and the second compensator actuator 25b engages the frame 5 at the second support position 20b on a surface of the frame 5 outside the vacuum chamber 6.

The linear motors 27a, 27b are for example linear induction motors, such as LIMMS linear motors, e.g. moving magnet LIMMS linear motors and/or coreless iron LIMMS linear motors. The reaction force of the linear induction motor moves the movable mass 26a, 26b without exerting forces on the frame 5.

Optionally, the first compensator actuator 25a comprises a mass position detector 28a. The mass position detector 28a is configured to detect the position of the moveable mass 26a in the first compensator actuator 25a. The mass position detector 28a is or contains for example an encoder. Optionally, in addition a low bandwidth feedback controller is provided such that the moveable mass 26a can be kept to move about the middle of its range of motion within the first compensator actuator 25a.

Optionally, likewise, the second compensator actuator 25b comprises a mass position detector 28b. The mass position detector 28b is configured to detect the position of the moveable mass 26b in the second compensator actuator 25b. The mass position detector 28b is or contains for example an encoder. Optionally, in addition a low bandwidth feedback controller is provided such that the moveable mass 26b can be kept to move about the middle of its range of motion within the second compensator actuator.

In the embodiment of FIG. 3, the torque compensator comprises a first compensator actuator and a second compensator actuator. However, from embodiment to embodiment, the number of compensator actuators that are present in the torque compensator may vary. Preferably, a compensator actuator is provided at each support position.

Figure 5:
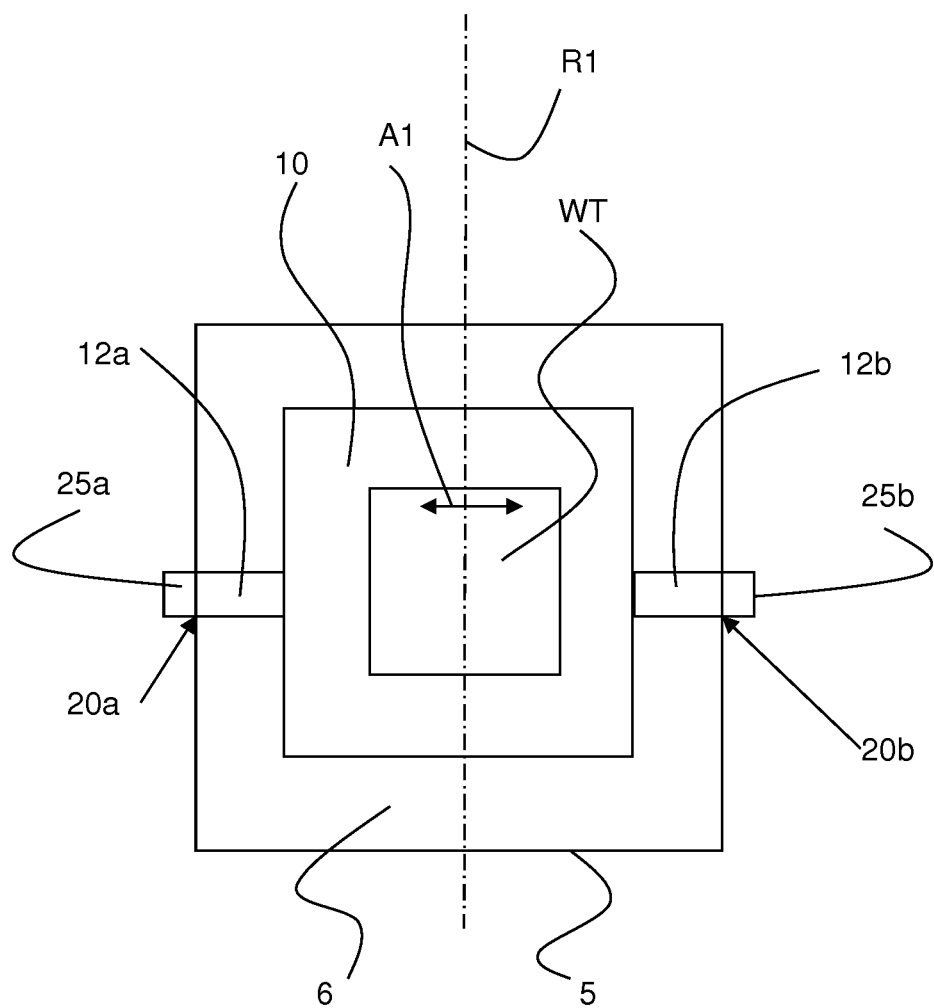

FIG. 5 schematically shows the embodiment of FIG. 3 in top view.

FIG. 5 shows the substrate support WT, the balance mass 10 and the frame 5. The substrate support WT and the balance mass are arranged within the vacuum chamber 6. The balance mass support comprises the first balance mass support device 12a, which engages the frame 5 at the first support position 20a. The balance mass support further comprises the second balance mass support device 12b, which engages the frame 5 at the second support position 20b. The first balance mass support device 12a and the second balance mass support device 12b are arranged on opposite sides of the balance mass 10.

In this embodiment, the torque compensator comprises a first compensator actuator 25a and a second compensator actuator 25b. The first compensator actuator 25a is arranged such that it exerts a first compensation force at the first support position 20a. The second compensator actuator 25b is arranged such that it exerts a second compensation force at the second support position 20b.

Accelerations of the substrate support WT in the direction A1 result in a balance mass torque around axis R1. This balance mass torque is counteracted by the compensation forces which are provided by the compensator actuators 25a, 25b.

Figure 6:
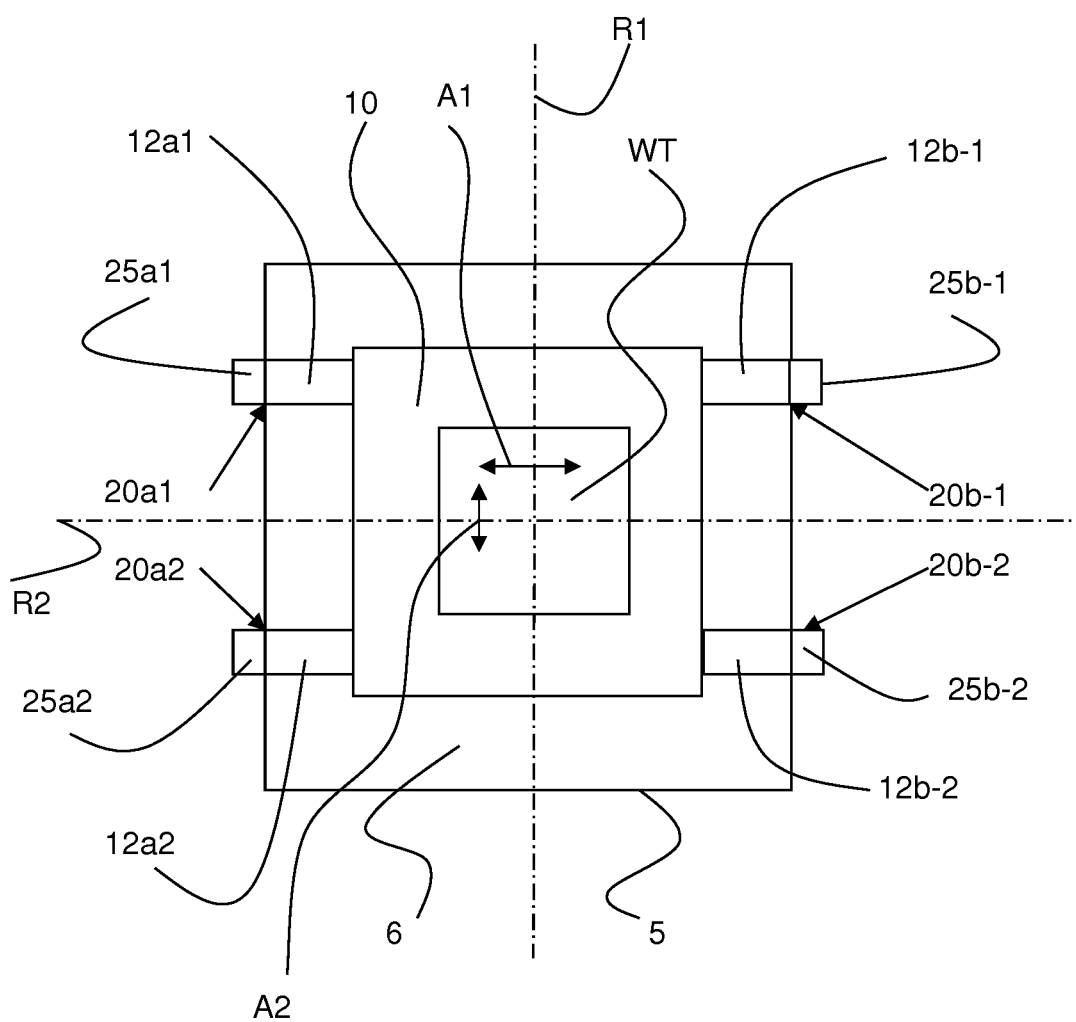

FIG. 6 schematically shows a variant of the embodiment of FIG. 3 in top view.

FIG. 6 shows the substrate support WT, the balance mass 10 and the frame 5. The substrate support WT and the balance mass are arranged within the vacuum chamber 6.

In the variant of FIG. 6, the balance mass support comprises two first balance mass support devices 12a1, 12a2, which engage the frame 5 at respective first support positions 20a1, 20a2. The balance mass support further comprises two second balance mass support devices 12b1, 12b2, which engage the frame 5 at respective second support positions 20b1, 20b2.

In this embodiment, the torque compensator comprises two first compensator actuators 25a1, 25a2 and two second compensator actuators 25b1, 25b2. The first compensator actuators 25a1, 25a2 are arranged such that the respective first compensation forces are exerted at the respective first support positions 20a1, 20a2. The second compensator actuators 25b1, 25b2 are arranged such that the respective second compensation forces are exerted at the respective second support positions 20b1, 20b2.

Accelerations of the substrate support WT in the direction A1 result in a balance mass torque around axis R1. This balance mass torque is counteracted by the compensation forces which are provided by the compensator actuators 25a1, 25a2, 25b1, 25b2. In this arrangement, alternatively or in addition, the compensator actuators 25a1, 25a2, 25b1, 25b2 can also counteract a balance mass torque around axis R2.

Figure 7:
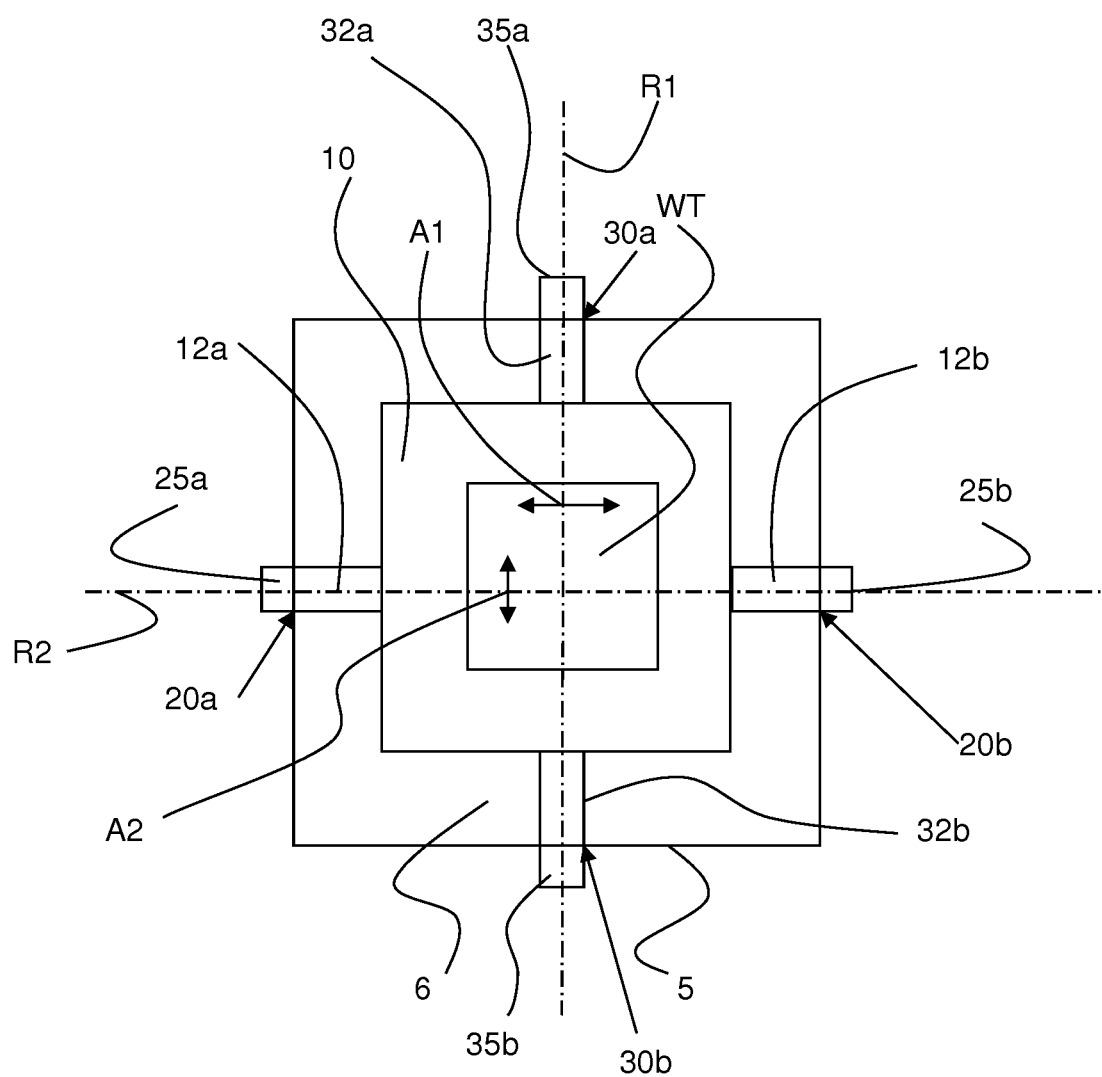

FIG. 7 schematically shows a further variant of the embodiment of FIG. 3 in top view.

FIG. 7 shows the substrate support WT, the balance mass 10 and the frame 5. The substrate support WT and the balance mass are arranged within the vacuum chamber 6. The balance mass support comprises the first balance mass support device 12a, which engages the frame 5 at the first support position 20a. The balance mass support further comprises the second balance mass support device 12b, which engages the frame 5 at the second support position 20b.

In addition, the balance mass support comprises a third balance mass support device 32a and a fourth balance mass support device 32b. The third balance mass support device 32a and the fourth balance mass support device 32b are arranged on opposite sides of the balance mass 10, but on different sides as those on which the first and second balance mass support devices 12a, 12b are arranged. The third balance mass support device 32a engages the frame 5 at a third support position 30a. The fourth balance mass support device 32b engages the frame 5 at a fourth support position 30b.

In this embodiment, the torque compensator comprises a first compensator actuator 25a a second compensator actuator 25b, a third compensator actuator 35a and a fourth compensator actuator 35b. The first compensator actuator 25a is arranged such that it exerts a first compensation force at the first support position 20a. The second compensator actuator 25b is arranged such that it exerts a second compensation force at the second support position 20b. The third compensator actuator 35a is arranged such that it exerts a third compensation force at the third support position 30a. The fourth compensator actuator 35b is arranged such that it exerts a fourth compensation force at the fourth support position 30b.

Accelerations of the substrate support WT in the direction A1 result in a balance mass torque around axis R1. This balance mass torque is counteracted by the compensation forces which are provided by the first and second compensator actuators 25a, 25b.

Accelerations of the substrate support WT in the direction A2 result in a balance mass torque around axis R2. This balance mass torque is counteracted by the compensation forces which are provided by the third and fourth compensator actuators 35a, 35b.

Figure 8:
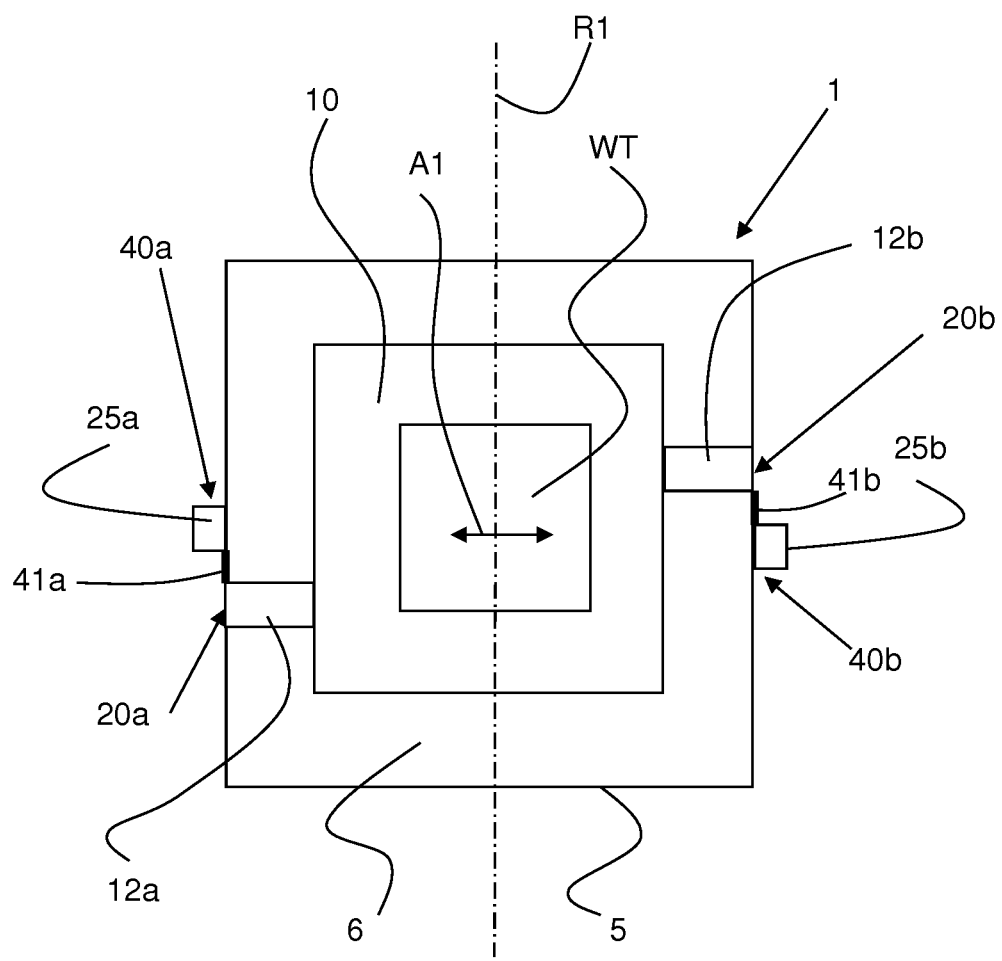

FIG. 8 schematically shows the further embodiment a positioning system 1 according to the invention, in top view.

In this embodiment, the torque compensator is not arranged such that the compensation force is exerted at the support position of the frame 5, but at a compensator position which is spaced apart form the support position. The compensator position is connected to the support position by a portion 41a, 41b of the frame 5 that is more rigid than the balance mass support. Preferably, this portion 41a, 41b of the frame is significantly more rigid than the balance mass support, e.g. at least 10 times more rigid. The rigid frame portion 41a, 41b is for example a part of the wall of the vacuum chamber 6, a reinforced portion of the wall of the vacuum chamber 6 or a connector piece of the required rigidity that is arranged on the wall of the vacuum chamber 6. Due to the rigidity of the frame portion 41a, 41b which extends between the respective support position 20a, 20b and the respective compensation position 40a, 40b, a similar effect can be obtained as when the torque compensator exerts the compensation force(s) directly at the support position. The embodiment of FIG. 8 may be employed for example when there is not sufficient space available to arrange the torque compensator such that it exerts the compensation force(s) directly at the support position.

FIG. 8 shows the substrate support WT, the balance mass 10 and the frame 5. The substrate support WT and the balance mass are arranged within the vacuum chamber 6. The balance mass support comprises the first balance mass support device 12a, which engages the frame 5 at the first support position 20a. The balance mass support further comprises the second balance mass support device 12b, which engages the frame 5 at the second support position 20b. The first balance mass support device 12a and the second balance mass support device 12b are arranged on opposite sides of the balance mass 10.

In this embodiment, the torque compensator comprises a first compensator actuator 25a and a second compensator actuator 25b. The first compensator actuator 25a is arranged such that it exerts a first compensation force at a first compensator position 40a. The second compensator actuator 25b is arranged such that it exerts a second compensation force at a second compensation position 40b.

Accelerations of the substrate support WT in the direction A1 result in a balance mass torque around axis R1. This balance mass torque is counteracted by the compensation forces which are provided by the compensator actuators 25a, 25b. In case the position of the compensator actuators 25a, 25b relative to each other, and/or the position of the support positions 20a, 20b relative to each other leads to the introduction of an additional torque on the frame 5, this additional torque is optionally also taken into account when determining the compensation forces, so the compensator actuators 25a, 25b also compensate this additional torque.

The embodiment of FIG. 8 can be combined with features of the other embodiments as shown in the figures.

Figure 9:
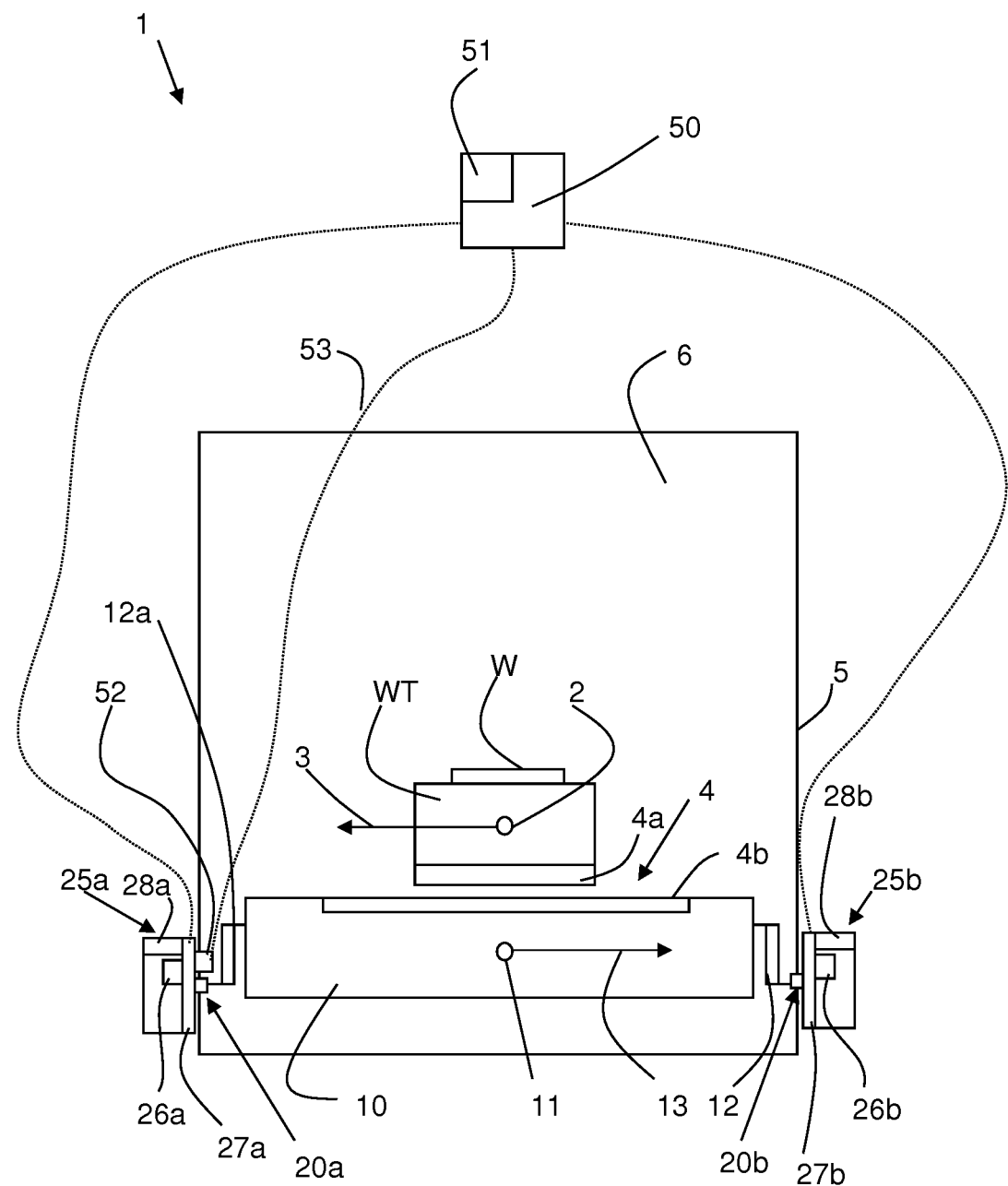

FIG. 9 schematically shows a further embodiment of a positioner system according to the invention.

In this embodiment, the torque compensator further comprises a controller 50 which is configured to generate or receive a compensator control signal which is based on position and/or acceleration of the moveable body WT relative to the balance mass 10, and to produce the compensation force on the basis of said compensator control signal. The controller 50 can be a separate entity that is dedicated to the torque compensator, or it can be integrated in an overall control system of the positioner system or in an overall control system of the lithographic apparatus (if the positioner system is used in a lithographic apparatus).

The acceleration of the moveable body WT and the balance mass 10 vary with time. In order to be able to exert an effective compensation force onto the frame 5, it is desirable that the variations in acceleration of the moveable body WT and the balance mass 10 lead to variations in the compensations force or compensation forces as exerted by the torque compensator. This can be achieved in various ways.

For example, a feed forward control loop can be used. This can for example be achieved by providing the controller 50 of the torque compensator with a data storage device 51 which contains data relating to the position and/or acceleration of the moveable body WT. This data preferably relates to the variations of the position and/or acceleration of the moveable body WT in time. The data for example relates to the desired position and/or acceleration of the moveable body WT over time, the expected position and/or acceleration of the moveable body WT over time, the calculated position and/or acceleration of the moveable body WT over time and/or the measured position and/or acceleration of the moveable body WT over time. The compensator control signal is then at least partially based on said data.

Optionally, alternatively or in addition, a feedback loop may be used. In that case, the torque compensator further comprises an acceleration sensor 52 which is configured to measure the acceleration of the frame 5 in a first direction and to generate an acceleration signal 53 based on the measured acceleration of the frame 5. Optionally, the acceleration sensor 52 is mounted at or close to the support position 20a, 20b. The controller 50 is then configured to receive said acceleration signal 53 and to use it as an input for generating the compensator control signal. Measuring the remaining acceleration of the frame and providing an additional compensating force to compensate for this acceleration improves the quality of the compensation and further improves the stability of the frame 5.

The features of the different embodiments of the positioner system according to FIGS. 2-9 can be combined with each other. For example, the controller 50 with the data storage device and/or the acceleration sensor 52 can be used in combination with all other embodiments.

Positioner systems as shown in the FIGS. 2-9 can be used in a lithographic apparatus, for example as a wafer stage positioner. Alternatively, positioner systems as shown in the FIGS. 2-9 can be used at other positions in a lithographic apparatus, for example as positioners for a reticle stage or reticle mask unit. Alternatively, they can be used in devices which are not lithographic apparatus, e.g. production machines, in which accurate positioning or limitation of the deformation of a frame is desired.

When a positioner system according to any of the FIGS. 2-9 is used in a lithographic apparatus, the moveable body is for example a substrate support WT, a reticle-mask unit or a reticle stage.

When a positioner system according to any of the FIGS. 2-9 is used in a lithographic apparatus which comprises a vacuum chamber 6, and the torque compensator comprises a compensator actuator 25, optionally the moveable body and the balance mass 10 are arranged inside said vacuum chamber 6, and the compensator actuator 25 is arranged outside said vacuum chamber 6.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning system, comprising:
a first actuator configured to exert an actuation force on a moveable body, the first actuator being coupled to a balance mass and configured to absorb a reaction force resulting from the actuation force generated by the first actuator, the actuation force providing an acceleration of the moveable body and the reaction force providing an acceleration of the balance mass in the opposite direction, wherein a force resulting from the acceleration of the moveable body together with a force resulting from the acceleration of the balance mass together result in a balance mass torque;
a balance mass support configured to support the balance mass onto a frame and to engage the frame at a support position; and
a torque compensator;
wherein the torque compensator is configured to exert a compensation force to compensate the balance mass torque, and
wherein the torque compensator is configured to exert the compensation force on the frame at the support position.

2. The positioning system of claim 1, wherein:
the balance mass support comprises a first balance mass support device and a second balance mass support device, the first balance mass support device and second balance mass support device are arranged on opposite sides of the balance mass,
the first balance mass support device engages the frame at a first support position,
the second balance mass support device engages the frame at a second support position,
the compensator comprises a first compensator actuator which is configured to exert a first compensation force on the frame at the first support position and a second compensator actuator which is configured to exert a second compensation force on the frame at the second support position, and
the first compensator actuator and the second compensator actuator are configured to cooperate to compensate the balance mass torque in a first rotational direction.

3. The positioning system of claim 2, wherein:
the balance mass support further comprises a third balance mass support device and a fourth balance mass support device, the third balance mass support device and fourth balance mass support device are arranged on opposite sides of the balance mass,
the third balance mass support device engages the frame at a third support position,
the fourth balance mass support device engages the frame at a fourth support position,
the compensator comprises a third compensator actuator which is configured to exert a third compensation force on the frame at the third support position and a fourth compensator actuator which is configured to exert a fourth compensation force on the frame at the fourth support position, and
the third compensator actuator and the fourth compensator actuator are configured to cooperate to compensate the balance mass torque in a second rotational direction.

4. The positioning system of claim 1, wherein the torque compensator comprises a linear motor adapted to move a moveable compensator mass.

5. The positioning system of claim 4, wherein the torque compensator further comprises a mass position detector configured to determine the position of the moveable mass of the torque compensator.

6. The positioning system of claim 1, wherein the torque compensator further comprises a controller configured to generate or receive a compensator control signal which is based on the position and/or acceleration of the moveable body relative to the frame, and to produce the compensation force on the basis of the compensator control signal.

7. The positioning system of claim 6, wherein:
the torque compensator further comprises an acceleration sensor configured to measure the acceleration of the moveable body in a first direction and to generate an acceleration signal based on the measured acceleration of the frame, and the controller is configured to receive the acceleration signal and to use it as an input for generating the compensator control signal.

8. The positioning system of claim 6, wherein:

the controller of the torque compensator comprises a data storage device which contains data relating to the desired position and/or acceleration of the moveable body, and the compensator control signal is at least partially based on the data.

9. A positioning system, comprising:

a first actuator configured to exert an actuation force on a moveable body, the first actuator being coupled to a balance mass and configured to absorb a reaction force resulting from the actuation force generated by the first actuator, the actuation force configured to provide an acceleration of the moveable body and the reaction force configured to provide an acceleration of the balance mass in the opposite direction, wherein a force resulting from the acceleration of the moveable body together with a force resulting from the acceleration of the balance mass together result in a balance mass torque;

a balance mass support configured to support the balance mass onto a frame, which balance mass support engages the frame at a support position; and a torque compensator;

wherein the torque compensator is configured to exert a compensation force to compensate the balance mass torque, wherein the torque compensator is configured to exert the compensation force on the frame at a compensator position, which compensator position is spaced apart from the support position, and wherein the compensator position is connected to the support position via a portion of the frame, which portion of the frame is more rigid than the balance mass support.

10. A lithographic apparatus comprising:

a positioning device comprising:

a first actuator configured to exert an actuation force on a moveable body, the first actuator being coupled to a balance mass and configured to absorb a reaction force resulting from the actuation force generated by the first actuator, the actuation force providing an acceleration of the moveable body and the reaction force providing an acceleration of the balance mass in the opposite direction, wherein a force resulting from the acceleration of the moveable body together with a force resulting from the acceleration of the balance mass together result in a balance mass torque;

a balance mass support configured to support the balance mass onto a frame and to engage the frame at a support position; and a torque compensator;

wherein the torque compensator is configured to exert a compensation force to compensate the balance mass torque, and wherein the torque compensator is configured to exert the compensation force on the frame at the support position.

11. The lithographic apparatus of claim 10, wherein the moveable body is a substrate support, a reticle-mask unit or a reticle stage.

12. The lithographic apparatus of claim 10, wherein:

the lithographic apparatus comprises a vacuum chamber;

the moveable body and the balance mass are arranged inside the vacuum chamber; and the torque compensator comprises a compensator actuator arranged outside the vacuum chamber.

13. A method for compensating a balance mass torque in a positioner system, comprising:

generating a balance mass torque by exerting an actuation force on a moveable body and absorbing a reaction force resulting from the actuation force by a balance mass, thereby causing an acceleration of the moveable body and an acceleration of the balance mass in an opposite direction, wherein a force resulting from the acceleration of the moveable body together with a force resulting from the acceleration of the balance mass together result in a balance mass torque, which balance mass torque is exerted via a balance mass support onto a frame at a support position, and compensating the balance mass torque exerted on the frame by a torque compensator which exerts a compensation force on the frame at the support position.

14. A method for compensating a balance mass torque in a positioner system, comprising:

generating a balance mass torque by exerting an actuation force on a moveable body and absorbing a reaction force resulting from the actuation force by a balance mass, thereby causing an acceleration of the moveable body and an acceleration of the balance mass in an opposite direction, wherein a force resulting from the acceleration of the moveable body together with a force resulting from the acceleration of the balance mass together result in a balance mass torque, which balance mass torque is exerted via a balance mass support onto a frame at a support position, and compensating the balance mass torque exerted on the frame by a torque compensator which exerts a compensation force at a compensator position, which compensator position is spaced apart from the support position, wherein the compensator position is connected to the support position via a portion of the frame, which portion of the frame is more rigid than the balance mass support.

15. A device manufacturing method comprising:

transferring a pattern from a patterning device onto a substrate, comprising the step of using a lithographic apparatus of claim 10.

* * * * *